United States Patent
Hwang et al.

(10) Patent No.: US 10,726,228 B2
(45) Date of Patent: Jul. 28, 2020

(54) SEMICONDUCTOR DEVICE FOR FINGERPRINT SENSING

(71) Applicant: Samsung Electronics Co., Ltd., Suwon-si, Gyeonggi-do (KR)

(72) Inventors: Hee Chang Hwang, Seoul (KR); Jae Jin Park, Seongnam-si (KR); Min Chul Lee, Seongnam-si (KR); Seung Hoon Lee, Hwaseong-si (KR); Dae Young Chung, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 271 days.

(21) Appl. No.: 15/648,320

(22) Filed: Jul. 12, 2017

(65) Prior Publication Data
US 2018/0039810 A1    Feb. 8, 2018

(30) Foreign Application Priority Data
Aug. 3, 2016   (KR) .................. 10-2016-0098874

(51) Int. Cl.
*G06K 9/00* (2006.01)
*H01L 23/528* (2006.01)

(52) U.S. Cl.
CPC ....... *G06K 9/0002* (2013.01); *G06K 9/00067* (2013.01); *H01L 23/528* (2013.01)

(58) Field of Classification Search
CPC . G06K 9/0002; G06K 9/00067; H01L 23/528
(Continued)

(56) References Cited

U.S. PATENT DOCUMENTS 5,717,786 A * 2/1998 Kamei ............... G06K 9/00067
                                              382/125
6,718,052 B1   4/2004 Matsumoto et al.
(Continued)

FOREIGN PATENT DOCUMENTS

JP   2010231418 A   10/2010
KR   101529033 B1   6/2015

OTHER PUBLICATIONS

Fisher et al., "Laplacian/Laplacian of Gaussian" https://web.archive.org/web/20150716114656/https://homepages.inf.ed.ac.uk/rbf/HIPR2/log.htm (Year: 2015).*
(Continued)

*Primary Examiner* — Andrew M Moyer
(74) *Attorney, Agent, or Firm* — Renaissance IP Law Group LLP

(57) ABSTRACT

A semiconductor device comprising a fingerprint sensor configured to generate first-direction sensing data and second-direction sensing data by sensing a fingerprint image in a first direction and a second direction, respectively, which is perpendicular to the first direction; a differential sensing circuit configured to generate first-direction first differential data and second-direction first differential data by performing a differential operation on the first-direction sensing data and the second-direction sensing data, respectively; and a fingerprint processing circuit configured to generate first-direction second differential data and second-direction second differential data by performing a differential operation on the first-direction first differential data and the second-direction first differential data, respectively, and generate fingerprint data by adding the first-direction second differential data and the second-direction second differential data.

19 Claims, 13 Drawing Sheets

(58) Field of Classification Search
USPC .......................................................... 382/124
See application file for complete search history.

(56) References Cited

U.S. PATENT DOCUMENTS

| | | |
|---|---|---|
| 7,460,697 B2 | 12/2008 | Erhart et al. |
| 7,512,257 B2 | 3/2009 | Hwang et al. |
| 8,712,114 B2 | 4/2014 | Thaniyath et al. |
| 8,888,004 B2 | 11/2014 | Setlak et al. |
| 9,298,966 B2 | 3/2016 | Setlak et al. |
| 2003/0161510 A1* | 8/2003 | Fujii .................. G06K 9/00026 382/124 |
| 2007/0069258 A1* | 3/2007 | Ahn .................. H01L 27/14634 257/290 |
| 2009/0245648 A1 | 10/2009 | Hara |
| 2012/0085822 A1* | 4/2012 | Setlak .................. G06K 9/0002 235/439 |
| 2015/0109214 A1* | 4/2015 | Shi .......................... G06F 3/044 345/173 |

OTHER PUBLICATIONS

"Sobel operator" https://en.wikipedia.org/w/index.php?title=Sobel_operator&direction=prev&oldid=672930775 (Year: 2015).*
"Image Gradient" https://en.wikipedia.org/w/index.php?title=Image_gradient&oldid=670949411 (Year: 2015).*

* cited by examiner

| 0  | 0 | 0 |
|----|---|---|
| -1 | 1 | 0 |
| 0  | 0 | 0 |

| 0 | -1 | 0 |
|---|----|---|
| 0 | 1  | 0 |
| 0 | 0  | 0 |

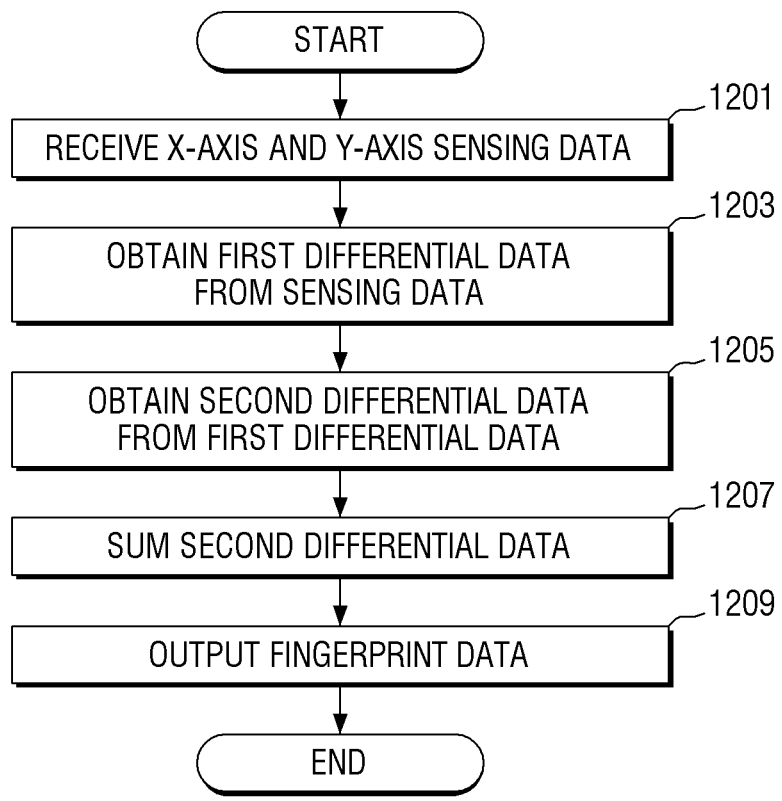

| -1 | 0 | 0 |
|----|---|---|
| 0  | 1 | 0 |
| 0  | 0 | 0 |

F5

| 0 | 0 | -1 |
|---|---|----|
| 0 | 1 | 0  |
| 0 | 0 | 0  |

F6

| -1 | 0 | -1 |
|----|---|----|
| 0  | 4 | 0  |
| -1 | 0 | -1 |

SEMICONDUCTOR DEVICE FOR FINGERPRINT SENSING

This application claims priority from Korean Patent Application No. 10-2016-0098874, filed on Aug. 3, 2016, and all the benefits accruing therefrom under 35 U.S.C. § 119, the disclosure of which is incorporated herein by reference in its entirety.

BACKGROUND

1. Field

Embodiments relate to a semiconductor device that can be used in fingerprint sensing.

2. Description of the Related Art

As fingerprint recognition becomes popular, the need for a precise fingerprint sensing technique has become stronger. A fingerprint is a group of curves consisting of ridges and valleys, and the edge components of a fingerprint image. However, when the range for detecting valid data from a signal obtained by sensing a fingerprint is very narrow, for example, when a fingerprint is sensed using a fingerprint sensor embedded in a capacitive touch panel, the removal of a common mode signal, external noise, rotation of a finger and the like is needed to precisely extract fingerprint data.

SUMMARY

Embodiments include a semiconductor device comprising a fingerprint sensor configured to generate first-direction sensing data and second-direction sensing data by sensing a fingerprint image in a first direction and a second direction, respectively, which is perpendicular to the first direction; a differential sensing circuit configured to generate first-direction first differential data and second-direction first differential data by performing a differential operation on the first-direction sensing data and the second-direction sensing data, respectively; and a fingerprint processing circuit configured to generate first-direction second differential data and second-direction second differential data by performing a differential operation on the first-direction first differential data and the second-direction first differential data, respectively, and generate fingerprint data by adding the first-direction second differential data and the second-direction second differential data.

Embodiments include a semiconductor device, comprising: a fingerprint sensor configured to generate first-direction sensing data and second-direction sensing data by sensing a fingerprint image in a first direction and a second direction, respectively, which is perpendicular to the first direction; and a sensing data processing circuit configured to generate fingerprint data using a two-dimensional (2D) differential isotropic filter.

Embodiments include a semiconductor device, comprising: a fingerprint sensor configured to generate sensing data; a sensing data processing circuit coupled to the fingerprint sensor and configured to generate fingerprint data by performing a first differential operation on the sensing data in a first direction and performing a second differential operation on the sensing data in a second direction; wherein the first direction is different from the second direction.

BRIEF DESCRIPTION OF THE DRAWINGS

The above and other embodiments will become more apparent by describing in detail particular embodiments with reference to the attached drawings, in which:

FIG. 2 is a schematic view illustrating an example anisotropic filter mask for image processing using a semiconductor device according to an embodiment;

FIG. 3 is a schematic view illustrating another example anisotropic filter mask for image processing using a semiconductor device according to an embodiment;

FIG. 12 is a flowchart illustrating an operating method of a semiconductor device according to an embodiment;

FIG. 13 is a schematic view illustrating an example isotropic filter mask for image processing using a semiconductor device according to an embodiment;

FIG. 15 is a schematic view illustrating examples filter mask for image processing using a semiconductor device according to various embodiments.

DETAILED DESCRIPTION

Figure 1:
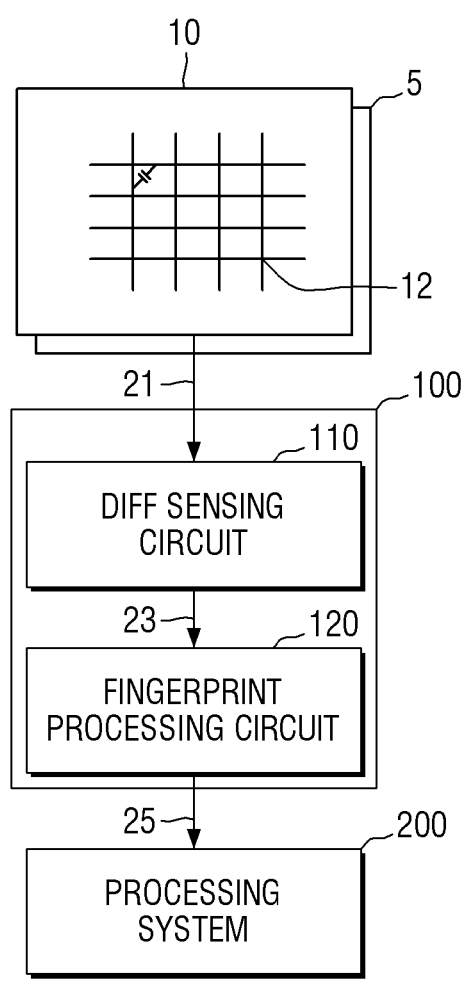
FIG. 1 is a block diagram of a semiconductor device according to an embodiment.

FIG. 1 is a block diagram of a semiconductor device according to an embodiment.

Referring to FIG. 1, the semiconductor device includes a display panel 5, a fingerprint sensor 10, and a sensing data processing circuit 100.

The display panel 5 may be a touch screen panel capable of recognizing the position of a touch made by a user pressing or touching the screen of the semiconductor device with a finger, a pen, or the like. The display panel 5 may include a touch panel, a controller integrated circuit (IC), and driver software (S/W).

In some embodiments, the touch panel may include upper and lower plates where transparent electrodes, such as those formed of indium tin oxide (ITO) are deposited. The touch panel may be configured to identify a location where a signal is generated in accordance with a touch or a variation in electric capacitance and transmit the signal to the controller IC. The controller IC may be configured to convert an analog signal transmitted by the touch panel into a digital signal, and the driver S/W may be configured to control the display panel 5 with the digital signal in accordance with the purpose of use of the display panel 5.

In some embodiments, the display panel 5 may be or include a resistive touch screen, a capacitive touch screen, a surface acoustic wave touch screen, or an infrared touch screen. In other embodiments, the display panel 5 may include a different type of touch screen.

The fingerprint sensor 10 may be configured to sense the user's touch and sense the user's fingerprint. For example, the fingerprint sensor 10 senses a fingerprint image including curves that consist of ridges and valleys. The fingerprint sensor 10 may be implemented as a separate element from the display panel 5, or the fingerprint sensor 10 and the display panel 5 may be incorporated into a single element. For example, the fingerprint sensor 10 may be formed to be stacked on the display panel 5. In another example, the fingerprint sensor 10 may be incorporated in the display panel 5.

In some embodiments, the fingerprint sensor 10 may be an on-cell touch active-matrix organic light-emitting diode (OCTA). In other embodiments, the fingerprint sensor 10 may be an in-cell-type fingerprint sensor embedded in the display panel 5.

The fingerprint sensor 10 includes driving lines and sensing lines, which are disposed to intersect the driving lines. Intersections 12 between the driving lines and the sensing lines may each have coordinates to represent the location of a touch input.

The sensing data processing circuit 100 may be configured to convert analog sensing data 21 sensed by the fingerprint sensor 10 into digital data and perform a variety of post-processing on the digital data, thereby generating fingerprint data 25. More specifically, the sensing data processing circuit 100 includes a differential sensing circuit 110 and a fingerprint processing circuit 120.

The differential sensing circuit 110 may be configured to receive sensing data from the fingerprint sensor 10, and generate first differential data by performing a differential operation on the sensing data 21.

The fingerprint processing circuit 120 may be configured to receive the first differential data from the differential sensing circuit 110, and generate second differential data by performing a differential operation on the first differential data. The fingerprint processing circuit 120 may be configured to generate fingerprint data based on the second differential data.

The operations of the differential sensing circuit 110 and the fingerprint processing circuit 120 will be described later in detail with reference to FIGS. 4 through 11.

When the range for detecting valid data from a signal obtained by sensing a fingerprint is very narrow, for example, when fingerprint sensing is performed using a fingerprint sensor embedded in a capacitive touch panel, the removal of a common mode signal, external noise, and the like is needed to more precisely extract fingerprint data. According to various embodiments, a fingerprint is sensed by generating differential data based on two adjacent sensing data from among other sensing data sensed by the fingerprint sensor 10. Thus, the precision of fingerprint recognition may be improved.

In some embodiments, the semiconductor device may also include a processing system 200, which may be configured to process fingerprint data provided by the fingerprint processing circuit 120. The processing system 200 may include a processor configured to perform various operations and a memory or storage device configured to store fingerprint data; however other embodiments may be different.

Figures 2, 3:
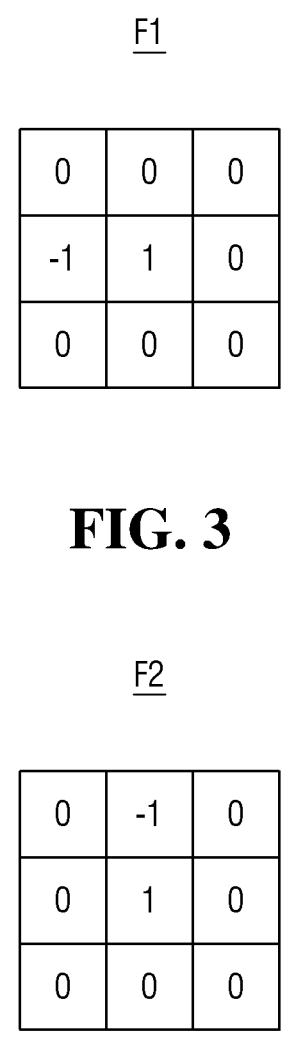

FIG. 2 is a schematic view illustrating an example differential anisotropic filter mask for image processing using a semiconductor device according to an embodiment, and FIG. 3 is a schematic view illustrating another example anisotropic filter mask for image processing using a semiconductor device according to an embodiment.

Referring to FIG. 2, an anisotropic filter mask F1 may be used to perform a differential operation on sensing data in a first direction (for example, an X-axis direction). That is, the application of the anisotropic filter mask F1 may mean performing a differential operation on first-direction sensing data sensed in the first direction by the fingerprint sensor 10. For example, first-direction first differential data $P_{out\_x\_diff}(x, y)$ may be obtained by performing a differential operation on first-direction sensing data $P_{in}(x, y)$, as indicated by Equation (1):

$$P_{out\_x\_diff}(x, y) = \frac{\partial}{\partial x} P_{in}(x, y). \tag{1}$$

Referring to FIG. 3, an anisotropic filter mask F2 may be used to perform a differential operation on sensing data in a second direction (for example, a Y-axis direction). That is, the application of the anisotropic filter mask F2 may mean performing a differential operation on second-direction sensing data sensed in the second direction by the fingerprint sensor 10. For example, second-direction first differential data $P_{out\_y\_diff}(x, y)$ may be obtained by performing a differential operation on second-direction sensing data $P_{in}(x, y)$, as indicated by Equation (2):

$$P_{out\_y\_diff}(x, y) = \frac{\partial}{\partial y} P_{in}(x, y). \tag{2}$$

However, when sensing is performed only in one direction, image distortion may occur depending on the direction in which the user inputs a fingerprint. Image distortion may also occur in a case in which a fingerprint image is rotated. Thus, according to various embodiments, fingerprint data are generated based on both sensing data obtained by performing a differential operation in the first direction and sensing data obtained by performing a differential operation in the second direction, which is perpendicular to the first direction.

That is, the first-direction first differential data $P_{out\_x\_diff}(x, y)$ obtained by Equation (1) and the second-direction first differential data $P_{out\_y\_diff}(x, y)$ obtained by Equation (2) may be subjected to a differential operation, as indicated by Equations (3) and (4), thereby obtaining first-direction second differential data $P_{out\_x\_diff2}(x, y)$ and second-direction second differential data $P_{out\_y\_diff2}(x, y)$:

$$P_{out\_x\_diff2}(x, y) = \frac{\partial}{\partial x} P_{out\_x\_diff}(x, y); \text{ and} \tag{3}$$

$$P_{out\_y\_diff2}(x, y) = \frac{\partial}{\partial y} P_{out\_y\_diff}(x, y). \tag{4}$$

Final fingerprint data $P_{out}(x, y)$ may be obtained by Equation (5):

$$P_{out}(x,y)=P_{out\_x\_diff2}(x,y)+P_{out\_y\_diff2}(x,y) \quad (5).$$

Fingerprint data generated in this manner can maintain or increase the precision of fingerprint recognition regardless of the direction in which a user inputs a fingerprint. Also, a greater uniformity of output can be provided in connection with the rotation of fingerprint data. Also, the ridges and valleys of a fingerprint can be emphasized, or can be extracted more easily, by improving a blur effect.

Referring again to FIG. 1, the first-direction first differential data $P_{out\_x\_diff}(x, y)$ and the second-direction first differential data $P_{out\_y\_diff}(x, y)$ correspond to the output 23 of the differential sensing circuit 110, and first-direction second differential data $P_{out\_x\_diff2}(x, y)$ and second-direction second differential data $P_{out\_y\_diff2}(x, y)$ are generated by the fingerprint processing circuit 120 and are then summed, thereby obtaining the final fingerprint data $P_{out}(x, y)$. The final fingerprint data $P_{out}(x, y)$ may correspond to the output 25 of the fingerprint processing circuit 120.

Operations of a semiconductor device according to various embodiments will hereinafter be described.

Figure 4:
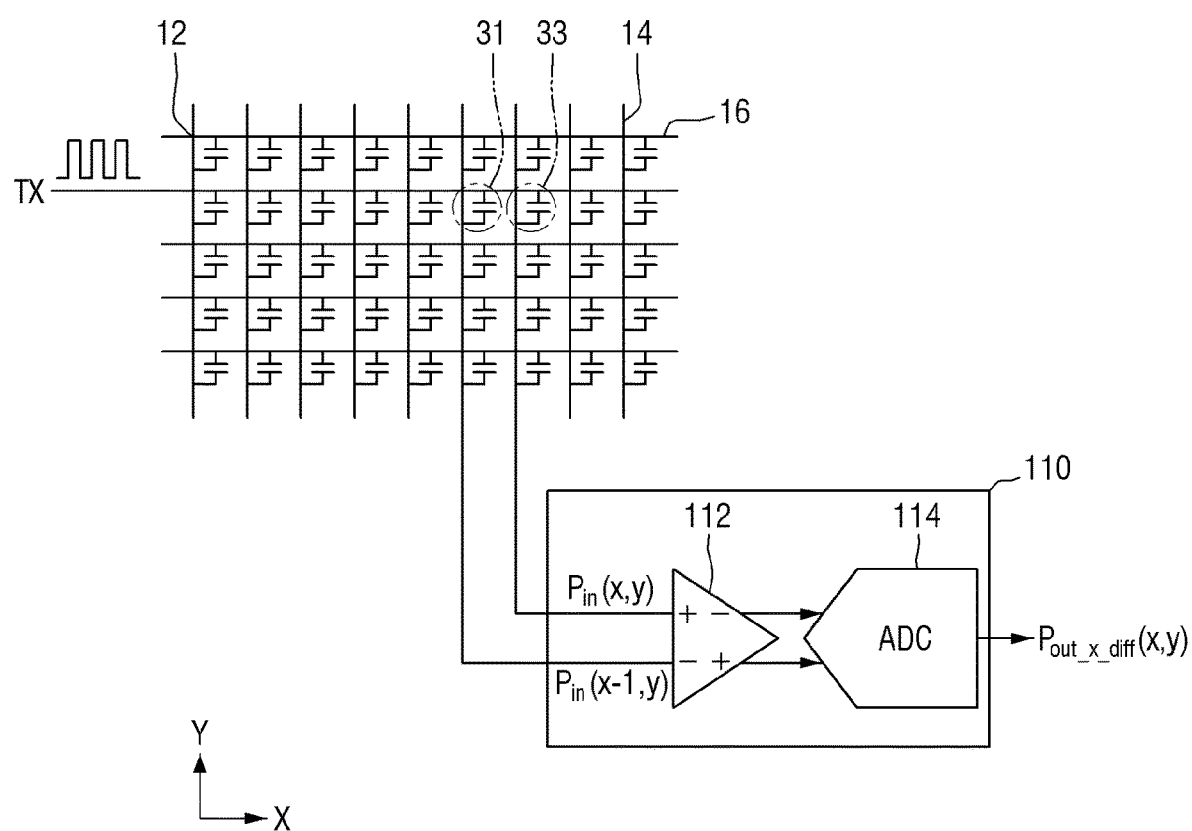
FIG. 4 is a schematic view illustrating the operation of a differential sensing circuit of a semiconductor device according to an embodiment.

FIG. 4 is a schematic view illustrating the operation of a differential sensing circuit of a semiconductor device according to an embodiment. Referring to FIG. 4, the fingerprint sensor 10 generates first-direction sensing data by sensing a fingerprint image in the first direction (for example, the X-axis direction) and the second direction (for example, the Y-axis direction), which is perpendicular to the first direction.

The fingerprint sensor 10 includes first lines 16, which extend in the first direction, and second lines 14, which extend in the second direction intersecting the first lines 16. When a fingerprint image is sensed in the first direction, the fingerprint sensor 10 uses the first lines 16 as driving lines and the second lines 14 as sensing lines. Accordingly, the first-direction sensing data may include two sensing data sensed from two second lines of the second lines 14 that are adjacent to each other in the first direction. More specifically, the first-direction sensing data may include two sensing data, i.e., sensing data $P_{in}(x, y)$ sensed from a second line 14 corresponding to a line intersection 33 and sensing data $P_{in}(x-1, y)$ sensed from a second line 14 corresponding to a line intersection 31.

The differential sensing circuit 110 is configured to perform a differential operation on the first-direction sensing data ($P_{in}(x, y)$ and $P_{in}(x-1, y)$), thereby generating the first-direction first differential data $P_{out\_x\_diff}(x, y)$.

The differential sensing circuit 110 may include a differential charge amplifier 112, which is configured to receive the first-direction sensing data ($P_{in}(x, y)$ and $P_{in}(x-1, y)$) and generate a differential voltage, and an analog-to-digital converter (ADC) 114, which is configured to receive the differential voltage and generate the first-direction first differential data $P_{out\_x\_diff}(x, y)$.

Figure 5:
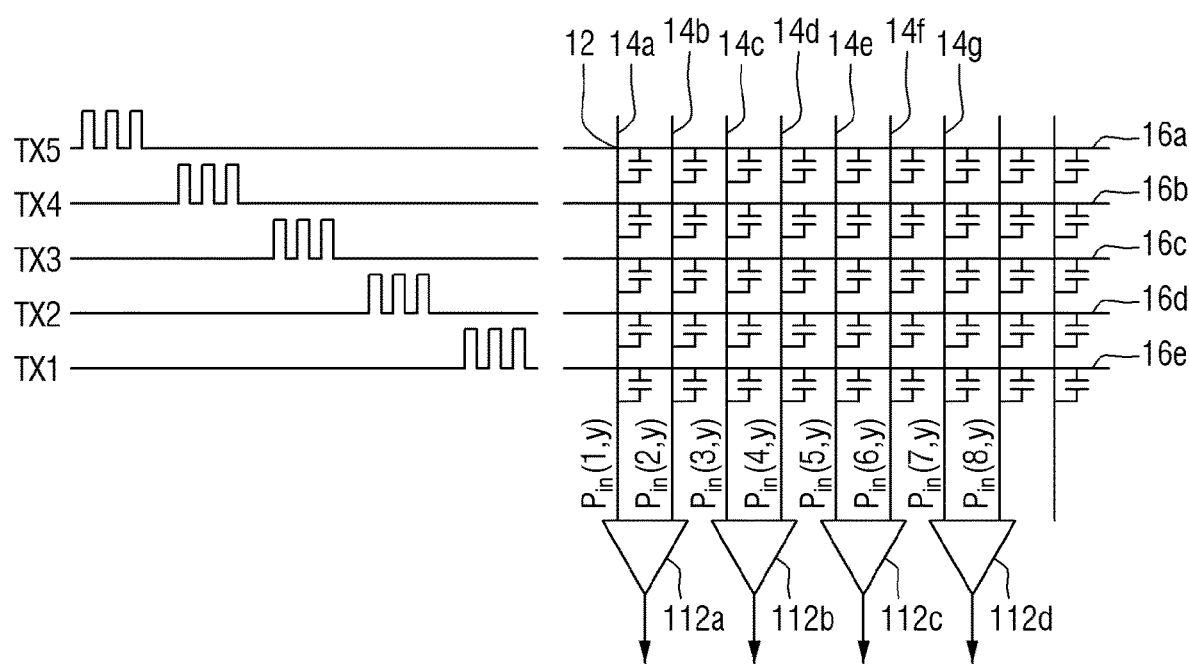
FIG. 5 is a schematic view illustrating a method of generating sensing data provided to a differential sensing circuit of a semiconductor device according to an embodiment.

FIG. 5 is a schematic view illustrating a method of generating sensing data provided to a differential sensing circuit of a semiconductor device according to an embodiment. Referring to FIG. 5, since a fingerprint image is sensed in the first direction, the fingerprint sensor 10 uses the first lines 16 as driving lines and the second lines 14 as sensing lines. More specifically, in response to a driving signal TX1 being applied to the fingerprint sensor 10, a first line 16e is activated as a driving line, and second lines 14a through 14g are activated as sensing lines. Accordingly, the fingerprint sensor 10 may generate sensing data $P_{in}(1, y)$ through $P_{in}(8, y)$ respectively corresponding to the intersections between the first line 16e and the second lines 14a through 14g.

The sensing data $P_{in}(1, y)$ and $P_{in}(2, y)$ may be input to a differential charge amplifier 112a of the differential sensing circuit 110 and may then be computed as first-direction first differential data $P_{out\_x\_diff}(2, y)$ by the ADC 114. The sensing data $P_{in}(3, y)$ and $P_{in}(4, y)$ may be input to a differential charge amplifier 112b of the differential sensing circuit 110 and may then be computed as first-direction first differential data $P_{out\_x\_diff}(4, y)$ by the ADC 114. Similarly, the sensing data $P_{in}(5, y)$ and $P_{in}(6, y)$ may be computed as first-direction first differential data $P_{out\_x\_diff}(6, y)$, and the sensing data $P_{in}(7, y)$ and $P_{in}(8, y)$ may be computed as first-direction first differential data $P_{out\_x\_diff}(8, y)$.

Thereafter, in response to a driving signal TX2 being applied to the fingerprint sensor 10, a first line 16d is activated as a driving line, and the second lines 14a through 14g are activated as sensing lines. Accordingly, the fingerprint sensor 10 may generate sensing data $P_{in}(1, y)$ through $P_{in}(8, y)$ respectively corresponding to the intersections between the first line 16d and the second lines 14a through 14g. First-direction first differential data $P_{out\_x\_diff}(2, y)$, $P_{out\_x\_diff}(4, y)$, $P_{out\_x\_diff}(6, y)$, and $P_{out\_x\_diff}(8, y)$ are obtained from the sensing data $P_{in}(1, y)$ through $P_{in}(8, y)$ similar to that described above. The first-direction first differential data $P_{out\_x\_diff}(2, y)$, $P_{out\_x\_diff}(4, y)$, $P_{out\_x\_diff}(6, y)$, and $P_{out\_x\_diff}(8, y)$ may be input to the fingerprint processing circuit 120 and may be converted into final fingerprint data.

Similarly, driving signals TX3 to TX5 may be applied to the fingerprint sensor 10, activating the first lines 16c to 16a, respectively. The first-direction first differential data $P_{out\_x\_diff}(2, y)$, $P_{out\_x\_diff}(4, y)$, $P_{out\_x\_diff}(6, y)$, and $P_{out\_x\_diff}(8, y)$ may be input to the fingerprint processing circuit 120 and may be converted into final fingerprint data as described above.

Figure 6:
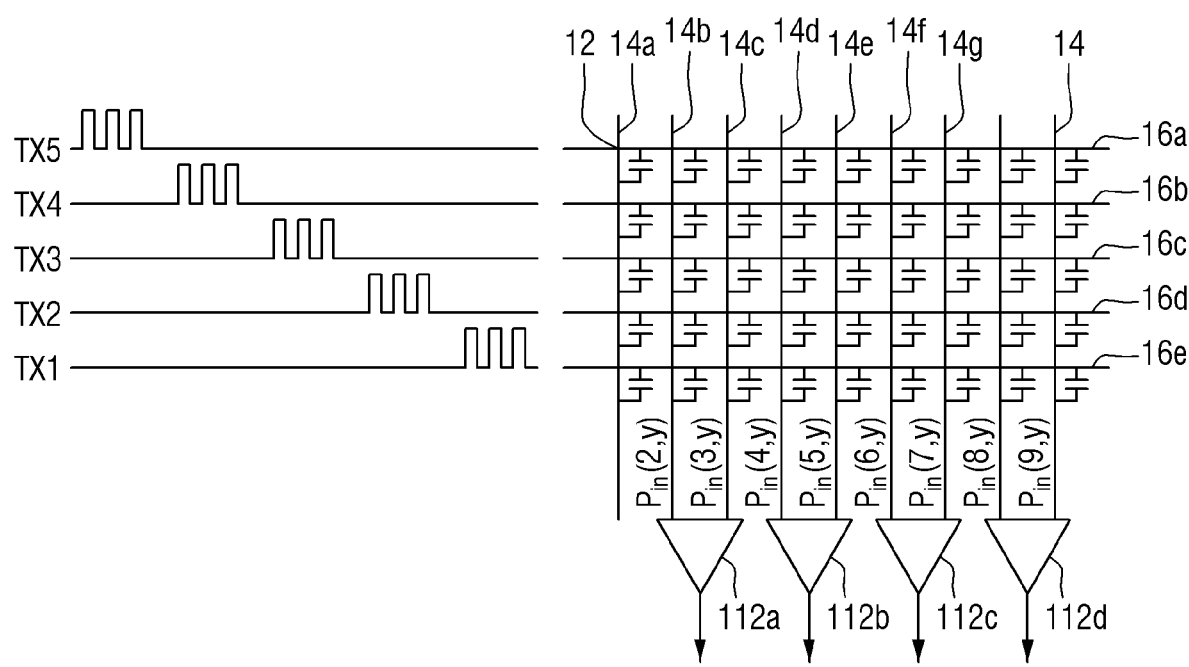
FIG. 6 is a schematic view illustrating a method of generating sensing data provided to a differential sensing circuit of a semiconductor device according to another embodiment.

FIG. 6 is a schematic view illustrating a method of generating sensing data provided to a differential sensing circuit of a semiconductor device according to another embodiment. Referring to FIG. 6, first differential data $P_{out\_x\_diff}(3, y)$, $P_{out\_x\_diff}(5, y)$, $P_{out\_x\_diff}(7, y)$, and $P_{out\_x\_diff}(9, y)$ may be generated similar to the first differential data $P_{out\_x\_diff}(2, y)$, $P_{out\_x\_diff}(4, y)$, $P_{out\_x\_diff}(6, y)$, and $P_{out\_x\_diff}(8, y)$ of FIG. 5. Accordingly, the first-direction first differential data $P_{out\_x\_diff}(2, y)$, $P_{out\_x\_diff}(4, y)$, $P_{out\_x\_diff}(6, y)$, and $P_{out\_x\_diff}(8, y)$ of FIG. 5 and the first-direction first differential data $P_{out\_x\_diff}(3, y)$, $P_{out\_x\_diff}(5, y)$, $P_{out\_x\_diff}(7, y)$, and $P_{out\_x\_diff}(9, y)$ of FIG. 6 may be input to the fingerprint processing circuit 120 and may be converted into final fingerprint data.

Figure 7:
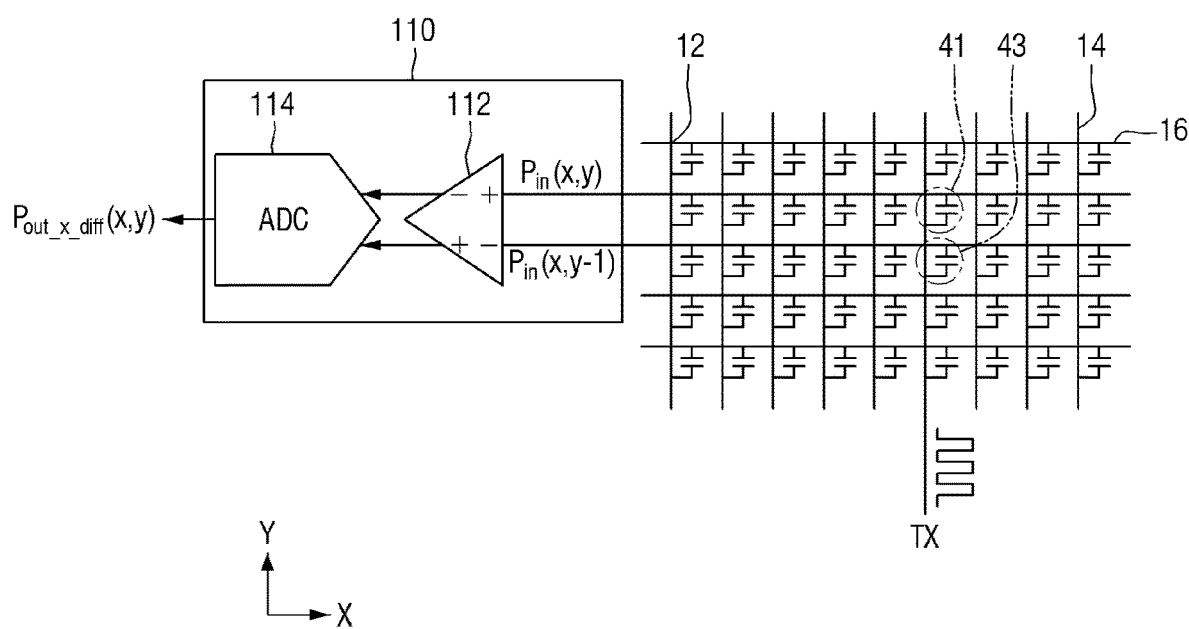
FIG. 7 is a schematic view illustrating the operation of a differential sensing circuit of a semiconductor device according to an embodiment.

FIG. 7 is a schematic view illustrating the operation of a differential sensing circuit of a semiconductor device according to an embodiment. Referring to FIG. 7, when a fingerprint image is sensed in the second direction, the fingerprint sensor 10 may use the first lines 16 as sensing lines and the second lines 14 as driving lines. Accordingly, second-direction sensing data may include two sensing data sensed from two first lines 16 of the first lines that are adjacent to each other in the second direction. More specifically, the second-direction sensing data may include two sensing data, i.e., sensing data $P_{in}(x, y)$ sensed from a first line 16 corresponding to a line intersection 41 and sensing data $P_{in}(x, y-1)$ sensed from a first line 16 corresponding to a line intersection 43. The differential sensing circuit 110 may be configured to operate to generate second-direction first differential data $P_{out\_y\_diff}(x, y)$ similar to the first-direction first differential data $P_{out\_x\_diff}(x, y)$ described above.

Figure 8:
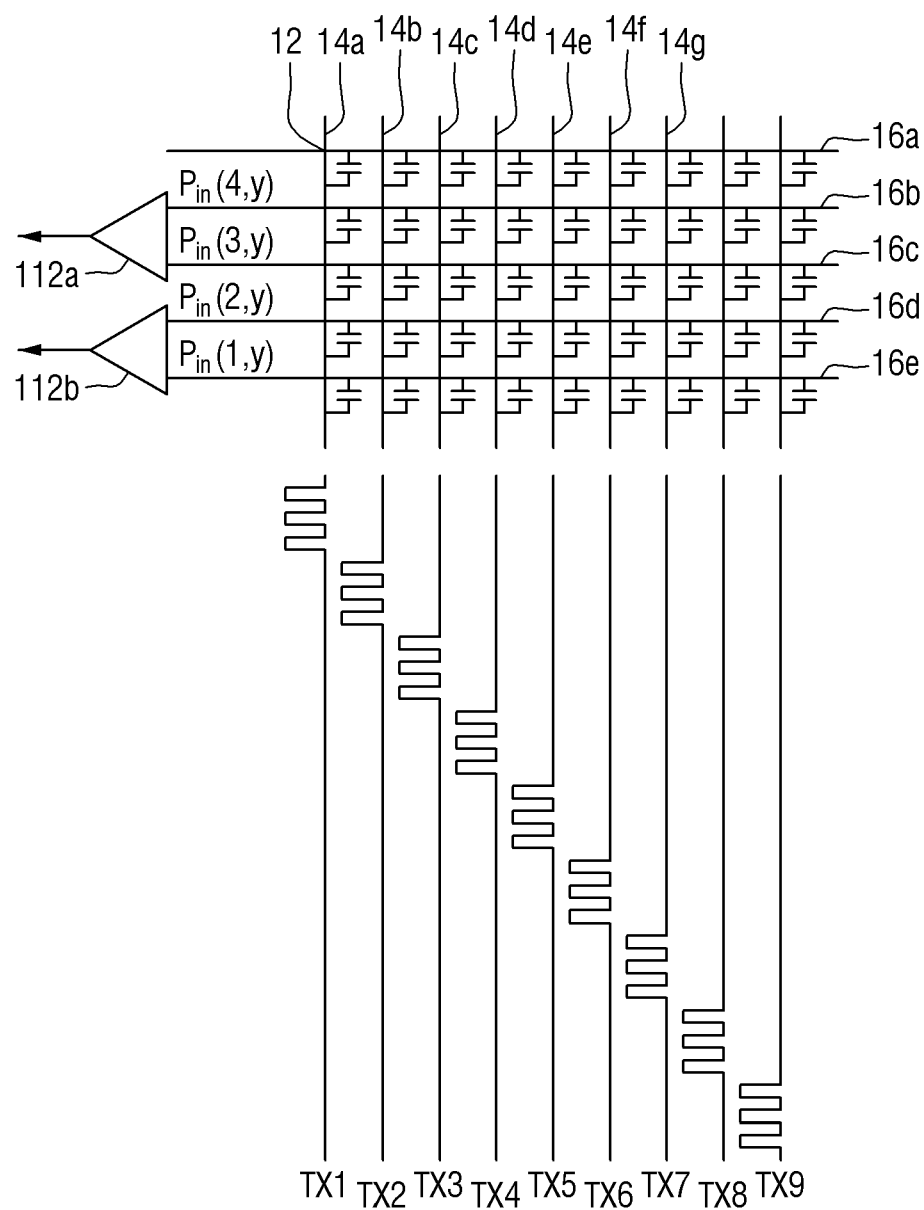
FIG. 8 is a schematic view illustrating a method of generating sensing data provided to a differential sensing circuit of a semiconductor device according to an embodiment.
Figure 9:
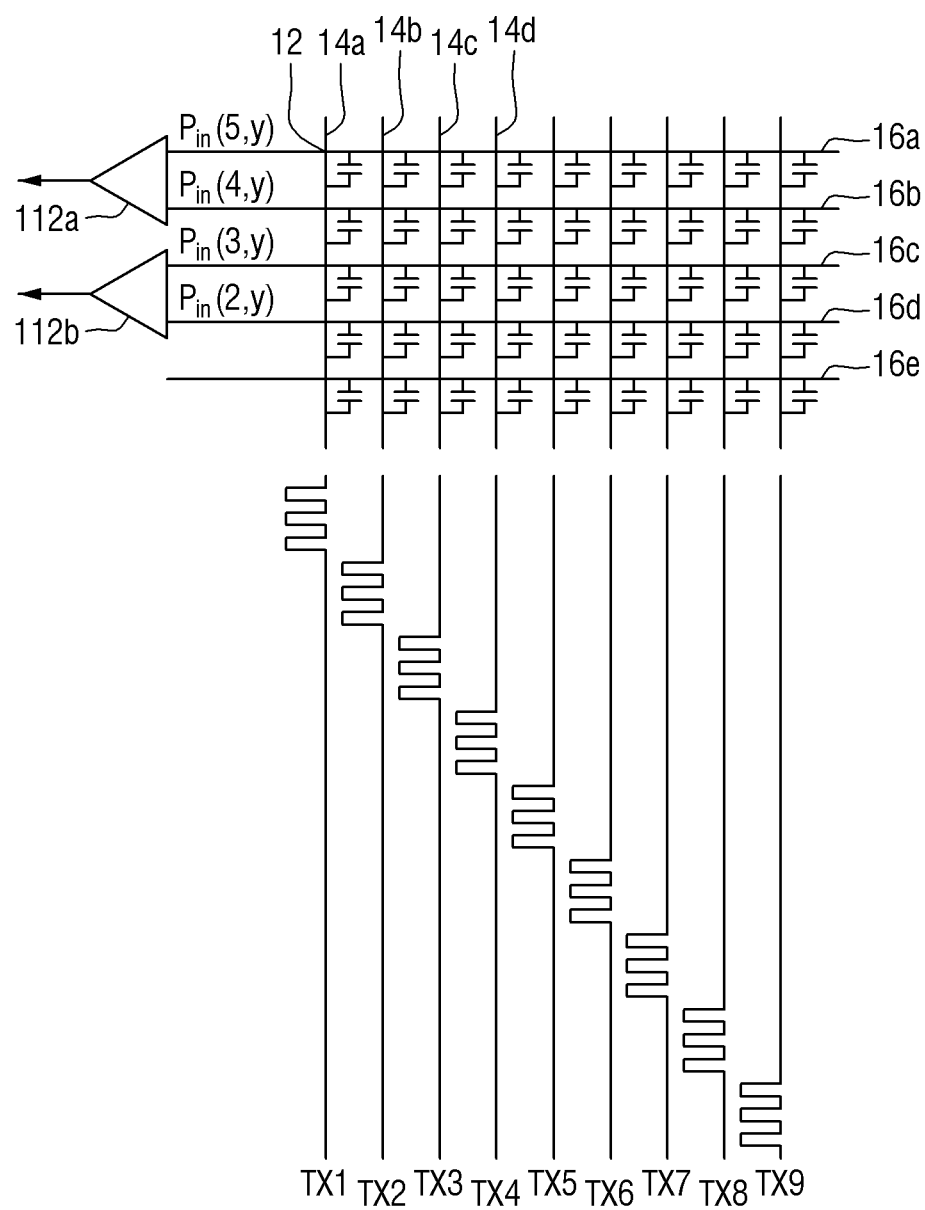
FIG. 9 is a schematic view illustrating a method of generating sensing data provided to a differential sensing circuit of a semiconductor device according to another embodiment.

FIG. 8 is a schematic view illustrating a method of generating sensing data provided to a differential sensing circuit of a semiconductor device according to an embodiment. FIG. 9 is a schematic view illustrating a method of generating sensing data provided to a differential sensing circuit of a semiconductor device according to another embodiment. Referring to FIGS. 8 and 9, since a fingerprint image is sensed in the second direction, the fingerprint sensor 10 uses the first lines 16 as sensing lines and the second lines 14 as driving lines. Similar to the operations described above with respect to FIGS. 5 and 6, the sensing data $P_{in}(1, y)$ through $P_{in}(5, y)$ may be generated by applying drive signals TX1 to TX 9 and that sensing data may be used to generate the second-direction first differential data $P_{out\_y\_diff}(1, y)$ and $P_{out\_y\_diff}(3, y)$ and the second-direction first differential data $P_{out\_y\_diff}(2, y)$ and $P_{out\_y\_diff}(4, y)$. The second-direction first differential data $P_{out\_y\_diff}(y)$ to $P_{out\_y\_diff}(4, y)$ may be input to the fingerprint processing circuit 120 and may be converted into final fingerprint data.

Although numbers of first lines 16, second lines 14, and corresponding differential sensing circuits 110 have been used as examples, in other embodiments, the number of such elements may be different. Furthermore, although in some embodiments, the same differential sensing circuits 110 are used for adjacent first or second lines 16 or 14, in other embodiments, different differential sensing circuits 110 may be used.

Figure 10:
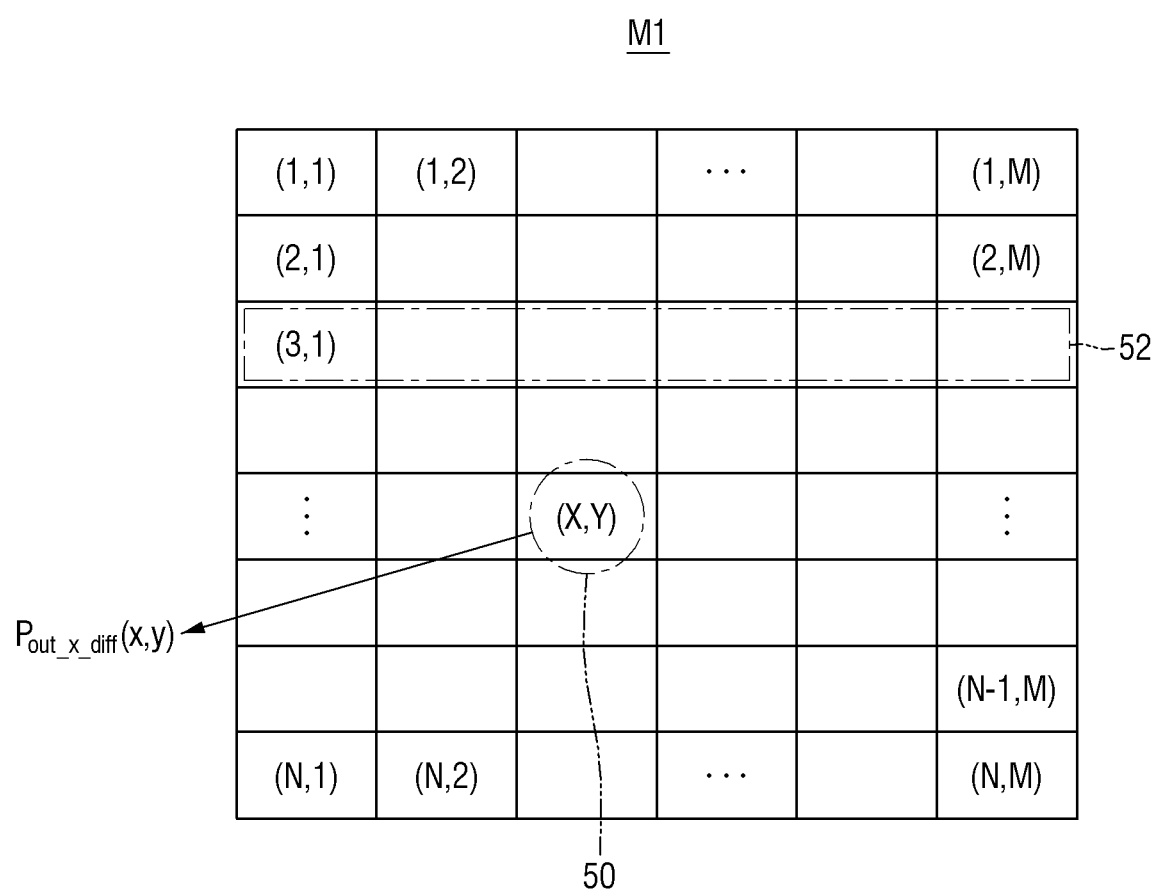
FIG. 10 is a schematic view illustrating first differential data obtained using a semiconductor device according to an embodiment.
Figure 11:
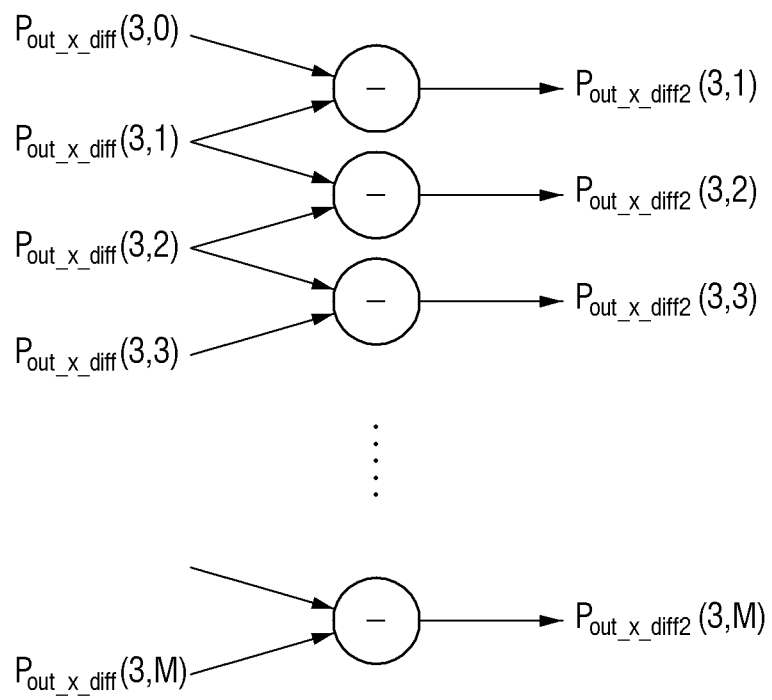
FIG. 11 is a schematic view illustrating an example of how to compute second differential data from the first differential data of FIG. 10.

FIG. 10 is a schematic view illustrating first differential data obtained using a semiconductor device according to an embodiment, and FIG. 11 is a schematic view illustrating an example of how to compute second differential data from the first differential data of FIG. 10. Referring to FIG. 10, first-direction first differential data $P_{out\_x\_diff}(3, y)$ in group 52 may include m-th, (m+1)-th, and (m+2)-th first-direction first differential data. More specifically, the first-direction first differential data $P_{out\_x\_diff}(3, y)$ may include first-direction first differential data $P_{out\_x\_diff}(3, 1)$, $P_{out\_x\_diff}(3, 2)$, $P_{out\_x\_diff}(3, M)$.

The fingerprint processing circuit 120 computes the difference between the m-th and (m+1)-th first-direction first differential data and computes the difference between the (m+1)-th and (m+2)-th first-direction first differential data, thereby generating first-direction second differential data $P_{out\_x\_diff2}(x, y)$. In a specific example, first-direction second differential data $P_{out\_x\_diff2}(3, 2)$ may be generated by computing the difference between the first-direction first differential data $P_{out\_x\_diff}(3, 1)$ and the first-direction first differential data $P_{out\_x\_diff}(3, 2)$, and first-direction second differential data $P_{out\_x\_diff2}(3, 3)$ may be generated by computing the difference between the first-direction first differential data $P_{out\_x\_diff}(3, 2)$ and the first-direction first differential data $P_{out\_x\_diff}(3, 3)$.

Dummy data $P_{out\_x\_diff}(3, 0)$ may be additionally used, depending on the purpose of use of the semiconductor device, to compute the first-direction second differential data $P_{out\_x\_diff2}(3, 2)$ and $P_{out\_x\_diff2}(3, 3)$; however, in other embodiments, the computation may be performed differently.

In a similar manner, second-direction second differential data $P_{out\_y\_diff}(x, y)$ may be computed from the second-direction first differential data $P_{out\_y\_diff}(x, y)$, but a detailed description of the computation of the second-direction second differential data $P_{out\_y\_diff2}(x, y)$ will be omitted.

Thereafter, final fingerprint data $P_{out}(x, y)$ may be obtained as shown in Equation (5). Fingerprint data generated in this manner can improve or maintain the precision of fingerprint recognition regardless of the direction in which a user applies a fingerprint. Also, the output may be made more uniform with the rotation of fingerprint data. Also, the ridges and valleys of a fingerprint can be emphasized, or can be extracted more easily, by improving a blur effect.

FIG. 12 is a flowchart illustrating an operating method of a semiconductor device according to an embodiment. Referring to FIG. 12, sensing data sensed by the fingerprint sensor 10 is received (1201). The sensing data may include first-direction (e.g., the X-axis direction) sensing data and second-direction (e.g., the Y-axis direction) sensing data.

Thereafter, first differential data are obtained from the first-direction sensing data and the second-direction sensing data (1203). The first differential data may include first-direction first differential data $P_{out\_x\_diff}(x, y)$ and second-direction first differential data $P_{out\_y\_diff}(x, y)$. Thereafter, first-direction second differential data $P_{out\_x\_diff2}(x, y)$ and second-direction second differential data $P_{out\_y\_diff2}(x, y)$ are obtained from the first-direction first differential data $P_{out\_x\_diff}(x, y)$ and the second-direction first differential data $P_{out\_y\_diff}(x, y)$ (1205).

Thereafter, the first-direction second differential data $P_{out\_x\_diff2}(x, y)$ and the second-direction second differential data $P_{out\_y\_diff2}(x, y)$ are added up (1207), and final fingerprint data $P_{out}(x, y)$ is output (1209).

FIG. 13 is a schematic view illustrating an example isotropic filter mask for image processing using a semiconductor device according to an embodiment. In the embodiment of FIG. 13, unlike in the embodiments of FIGS. 2 and 3, the sensing data processing circuit 100 may generate fingerprint data using an isotropic filter mask F3.

Fingerprint data generated in this manner can maintain or improve the precision of fingerprint recognition regardless of the direction in which a user applies a fingerprint. Also, the output may be made more uniform with the rotation of fingerprint data. Also, the ridges and valleys of a fingerprint can be emphasized, or can be extracted more easily, by improving a blur effect.

Figure 14:
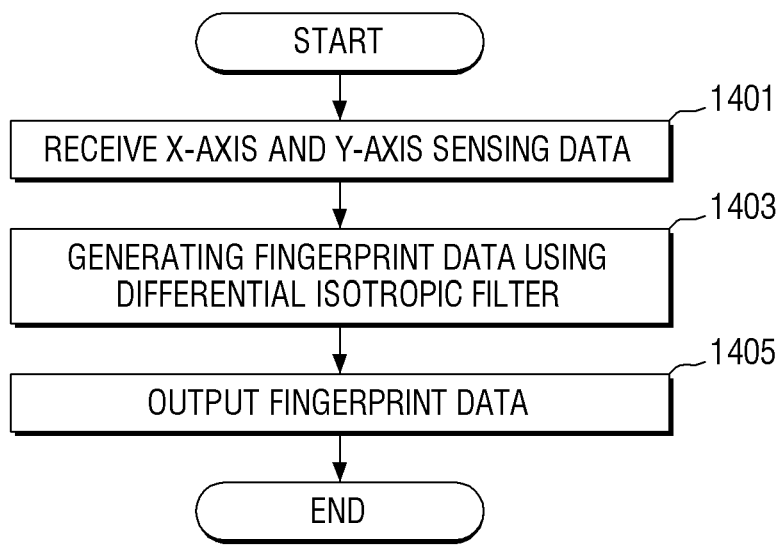
FIG. 14 is a flowchart illustrating an operating method of a semiconductor device according to another embodiment.

FIG. 14 is a flowchart illustrating an operating method of a semiconductor device according to another embodiment. Referring to FIG. 14, sensing data sensed by the fingerprint sensor 10 is received (1401). The sensing data may include first-direction (e.g., the X-axis direction) sensing data and second-direction (e.g., the Y-axis direction) sensing data.

Thereafter, the sensing data processing circuit 100 may generate fingerprint data (1403) using the isotropic filter mask F3 of FIG. 13, and may output the fingerprint data (1405).

Figure 15:
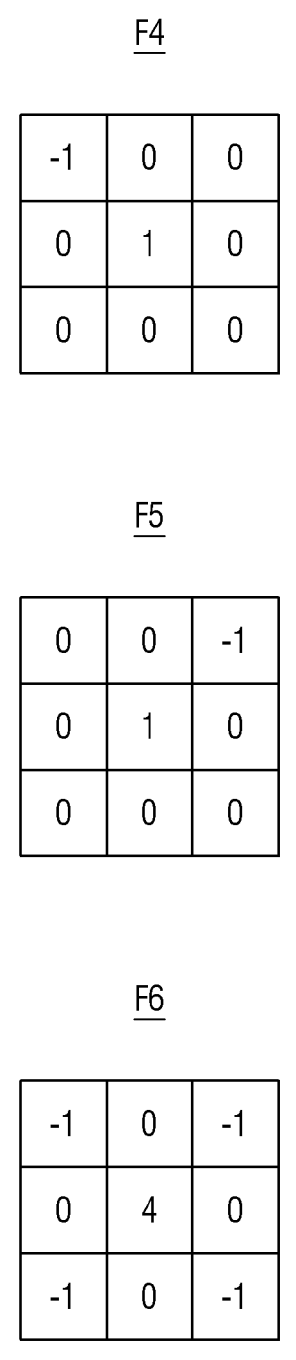

FIG. 15 is a schematic view illustrating examples filter mask for image processing using a semiconductor device according to various embodiments. In some embodiments, the filter mask may be aligned to the intersections 12 of a fingerprint sensor 10 differently than the filter masks described above. For example, filter masks F4, F5, and F6 may be similar to the filter masks F1, F2, and F3, respectively, but rotated by 45 degrees or otherwise aligned to diagonally to the intersections 12. In addition, in some embodiments, sensing data processed using one or more of filter masks F1-F6 may be combined together to generate the fingerprint data.

Embodiments have been described with reference to the accompanying drawings. However, those skilled in the art will appreciate that other embodiments may have many variations and modifications. Therefore, the disclosed embodiments are used in a generic and descriptive sense only and not for purposes of limitation.

What is claimed is:

1. A semiconductor device, comprising:
a fingerprint sensor configured to generate analog first-direction sensing data and analog second-direction sensing data by sensing a fingerprint image in a first direction and a second direction, respectively, which is perpendicular to the first direction;
a differential sensing circuit configured to generate digital first-direction first differential data and digital second-direction first differential data by performing a differential operation on the analog first-direction sensing data and the analog second-direction sensing data, respectively; and
a fingerprint processing circuit configured to generate first-direction second differential data and second-direction second differential data by performing a differential operation on the digital first-direction first differential data and the digital second-direction first differential data, respectively, and generate fingerprint data by adding the first-direction second differential data and the second-direction second differential data.

2. The semiconductor device of claim 1, wherein the differential sensing circuit includes:
a differential charge amplifier configured to receive the analog first-direction sensing data from a first pair of adjacent sensing lines in the fingerprint sensor or the analog second-direction sensing data from a second pair of adjacent sensing lines in the fingerprint sensor and generate a differential voltage; and
an analog-to-digital converter (ADC) configured to receive the differential voltage and generate the corresponding digital first-direction first differential data or digital second-direction first differential data.

3. The semiconductor device of claim 2, wherein:
the fingerprint sensor includes a plurality of first lines extending in the first direction and a plurality of second lines extending in the second direction and intersecting the first lines;
when the fingerprint image is sensed in the first direction, the first lines are configured as driving lines, and the second lines are configured as the sensing lines; and
when the fingerprint image is sensed in the second direction, the first lines are configured as the sensing lines, and the second lines are configured as driving lines.

4. The semiconductor device of claim 3, wherein the analog first-direction sensing data include two sensing data sensed from two second lines of the plurality of second lines that are adjacent to each other in the first direction.

5. The semiconductor device of claim 3, wherein the analog second-direction sensing data include two sensing data sensed from two first lines of the plurality of first lines that are adjacent to each other in the second direction.

6. The semiconductor device of claim 1, wherein
the digital first-direction first differential data include m-th, (m+1)-th, and (m+2)-th first-direction first differential data, where m is a natural number, and
the fingerprint processing circuit is configured to generate the first-direction second differential data by computing a difference between the m-th and (m+1)-th first-direction first differential data and computing a difference between the (m+1)-th and (m+2)-th first-direction first differential data.

7. The semiconductor device of claim 1, wherein
the digital second-direction first differential data include n-th, (n+1)-th, and (n+2)-th second-direction first differential data, where n is a natural number, and
the fingerprint processing circuit is configured to generate the second-direction second differential data by computing a difference between the n-th and (n+1)-th second-direction first differential data and computing a difference between the (n+1)-th and (n+2)-th second-direction first differential data.

8. The semiconductor device of claim 1, wherein the fingerprint sensor includes an on-cell-type sensor or an in-cell-type sensor.

9. The semiconductor device of claim 1, further comprising a display panel, wherein the fingerprint sensor is embedded in the display panel and is configured to generate the analog first-direction sensing data and the analog second-direction sensing data by sensing a touch on the display panel.

10. The semiconductor device of claim 1, wherein the differential sensing circuit is configured to perform the differential operation on the analog first-direction sensing data and the analog second-direction sensing data by applying an isotropic filter mask.

11. The semiconductor device of claim 1, wherein the differential sensing circuit is configured to perform the differential operation on the analog first-direction sensing data and the analog second-direction sensing data by applying an anisotropic filter mask.

12. A semiconductor device, comprising:
a differential sensing circuit configured to receive analog first-direction sensing data and analog second-direction sensing data generated by sensing a fingerprint image in a first direction and a second direction, respectively, and configured to generate digital first-direction first differential data and digital second-direction first differential data by performing a differential operation on the analog first-direction sensing data and the analog second-direction sensing data, respectively; and
a fingerprint processing circuit configured to generate first-direction second differential data and second-direction second differential data by performing a differential operation on the digital first-direction first differential data and the digital second-direction first differential data, respectively, and generate fingerprint data by adding the first-direction second differential data and the second-direction second differential data,
wherein the second direction is perpendicular to the first direction.

13. The semiconductor device of claim 12, further comprising:
a fingerprint sensor configured to generate the analog first-direction sensing data and the analog second-direction sensing data,
wherein:
the fingerprint sensor includes a plurality of first lines extending in the first direction, and a plurality of second lines extending in the second direction and intersecting the first lines;
when the fingerprint image is sensed in the first direction, the first lines are used as driving lines, and the second lines are used as sensing lines; and
when the fingerprint image is sensed in the second direction, the first lines are used as sensing lines, and the second lines are used as driving lines.

14. The semiconductor device of claim 13, wherein the analog first-direction sensing data include two sensing data sensed from two second lines of the plurality of second lines that are adjacent to each other in the first direction.

15. The semiconductor device of claim 13, wherein the analog second-direction sensing data include two sensing data sensed from two first lines of the plurality of first lines that are adjacent to each other in the second direction.

16. The semiconductor device of claim 13, wherein the fingerprint sensor includes an on-cell-type sensor or an in-cell-type sensor.

17. A processing system, comprising:
a processor configured to process a fingerprint data; and
a storage device configured to store the fingerprint data,
wherein the fingerprint data is generated by:
generating analog first-direction sensing data and analog second-direction sensing data by sensing a fingerprint image in a first direction and a second direction, respectively, wherein the second direction is perpendicular to the first direction,
generating digital first-direction first differential data and digital second-direction first differential data by performing a differential operation on the analog first-direction sensing data and the analog second-direction sensing data, respectively,
generating first-direction second differential data and second-direction second differential data by performing a differential operation on the digital first-direction first differential data and the digital second-direction first differential data, respectively, and
adding the first-direction second differential data and the second-direction second differential data.

18. The processing system of claim 17, wherein
the digital first-direction first differential data include m-th, (m+1)-th, and (m+2)-th first-direction first differential data, where m is a natural number, and
the generating first-direction second differential data is performed by computing a difference between the m-th and (m+1)-th first-direction first differential data and computing a difference between the (m+1)-th and (m+2)-th first-direction first differential data.

19. The processing system of claim 17, wherein
the digital second-direction first differential data include n-th, (n+1)-th, and (n+2)-th second-direction first differential data, where n is a natural number, and
the generating second-direction second differential data is performed by computing a difference between the n-th and (n+1)-th second-direction first differential data and computing a difference between the (n+1)-th and (n+2)-th second-direction first differential data.

* * * * *